US006666703B2

(12) United States Patent
Takeuchi

(10) Patent No.: US 6,666,703 B2
(45) Date of Patent: Dec. 23, 2003

(54) CONNECTOR FOR INTEGRATED CIRCUITS, AND ASSEMBLY FOR USE ON INTEGRATED CIRCUITS

(75) Inventor: Shinobu Takeuchi, Adachi-gun (JP)

(73) Assignee: Moldec Co., Ltd., Fukushima (JP)

( * ) Notice: Subject to any disclaimer, the term of this patent is extended or adjusted under 35 U.S.C. 154(b) by 0 days.

(21) Appl. No.: 10/131,257

(22) Filed: Apr. 25, 2002

(65) Prior Publication Data

US 2003/0092305 A1 May 15, 2003

(30) Foreign Application Priority Data

Nov. 15, 2001 (JP) ........................................ 2001-350722

(51) Int. Cl.⁷ .............................................. H01R 13/62
(52) U.S. Cl. ........................ 439/342; 439/331; 439/266
(58) Field of Search ................................. 439/331, 342, 439/259, 343, 484, 487, 266; 361/704, 707; 257/727

(56) References Cited

U.S. PATENT DOCUMENTS

| | | | | |
|---|---|---|---|---|
| 5,489,217 A | * | 2/1996 | Scheitz et al. .............. 439/342 |
| 5,578,870 A | * | 11/1996 | Farnsworth et al. ......... 257/727 |
| 5,646,447 A | * | 7/1997 | Ramsey et al. .............. 439/331 |
| 6,086,387 A | * | 7/2000 | Gallagher et al. ........... 439/331 |
| 6,243,267 B1 | * | 6/2001 | Chuang ........................ 439/342 |
| 6,354,859 B1 | * | 3/2002 | Barabi et al. ................ 439/331 |
| 6,447,322 B1 | * | 9/2002 | Yan et al. .................... 439/331 |
| 6,485,320 B1 | * | 11/2002 | Ma .............................. 439/342 |
| 6,540,541 B2 | * | 4/2003 | Ma .............................. 439/342 |

* cited by examiner

*Primary Examiner*—P. Austin Bradley
*Assistant Examiner*—Briggitte R. Hammond
(74) *Attorney, Agent, or Firm*—Paul A. Guss

(57) ABSTRACT

A connector has an inner case connected to a circuit board by reflow soldering, an outer case slidable back and forth on the inner case, and a cover covering the surface of a CPU disposed on the outer case. The cover has a plated metal shield on its surface and is electrically connected to an electrically conductive heat radiator through a clip. When the CPU is covered by the cover and the heat radiator is mounted on the CPU, the cover is disposed between the heat radiator and the CPU. Since the CPU is covered by the cover, the heat radiator can be removed from the CPU without posing burdens on the CPU. The shield of the cover is effective to block electromagnetic waves generated by the CPU.

27 Claims, 13 Drawing Sheets

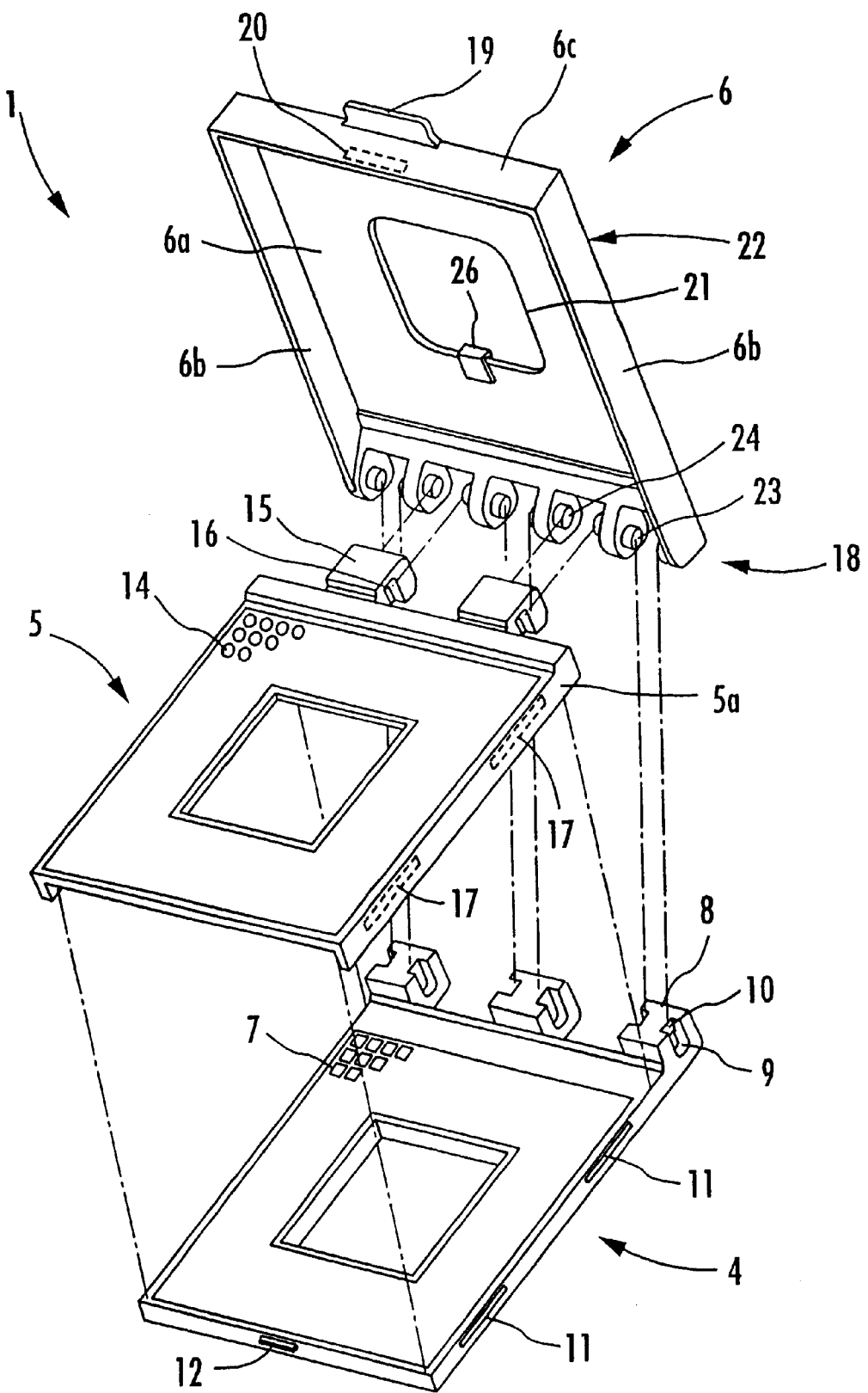

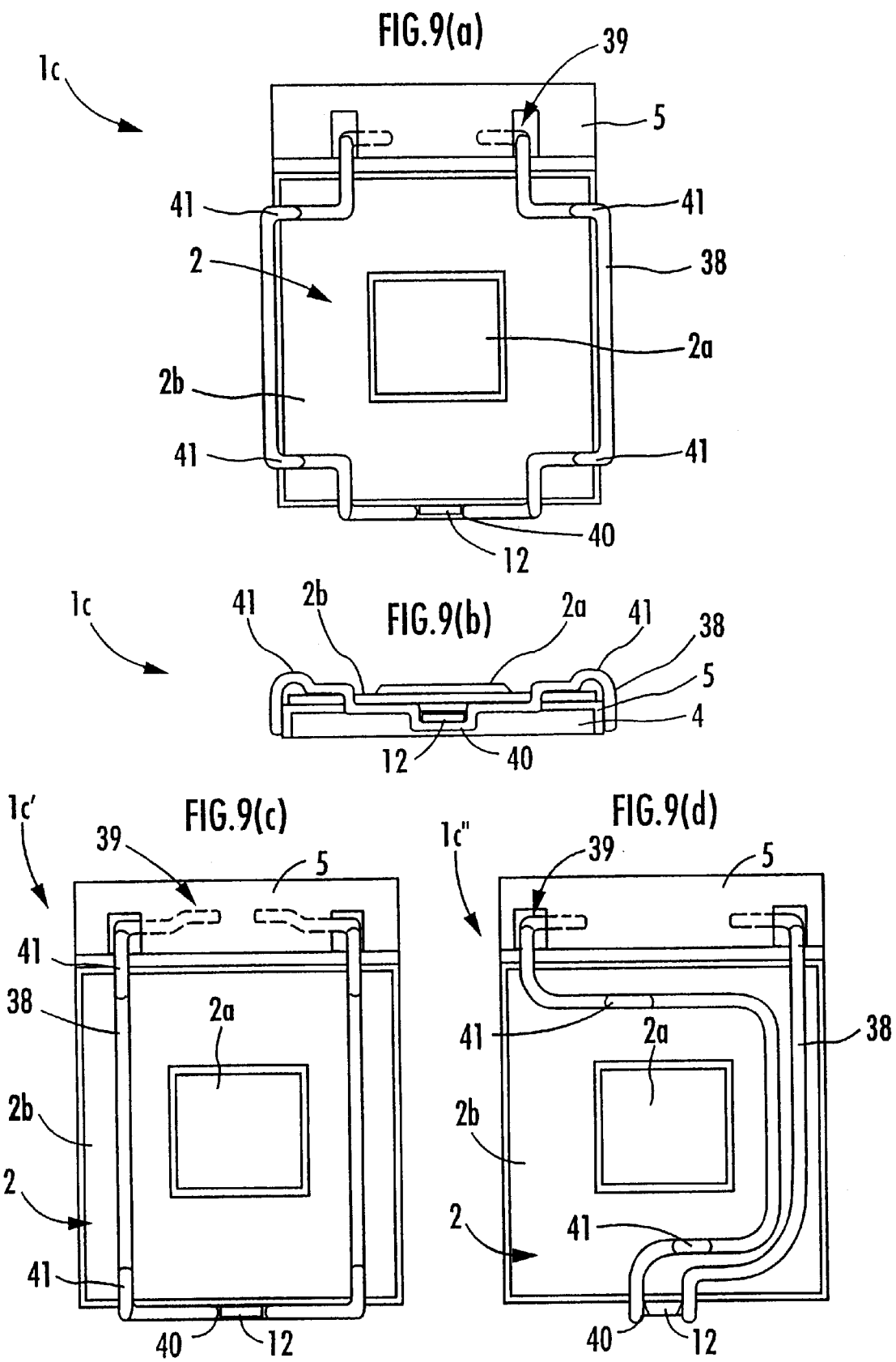

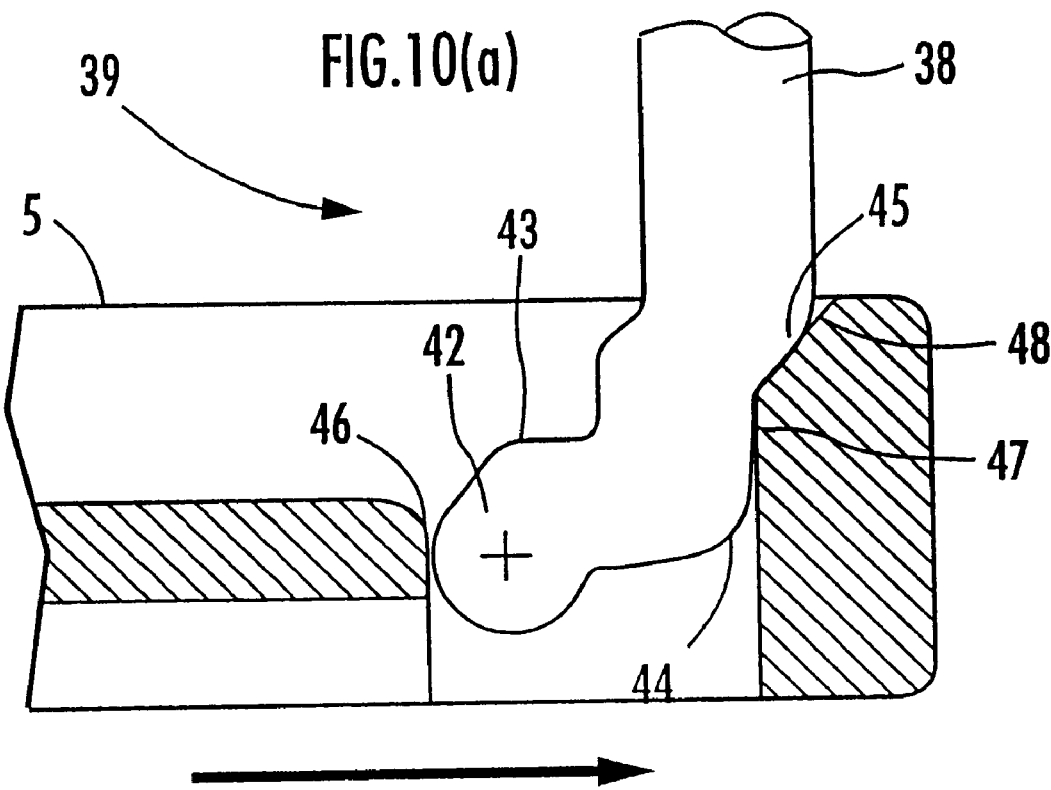
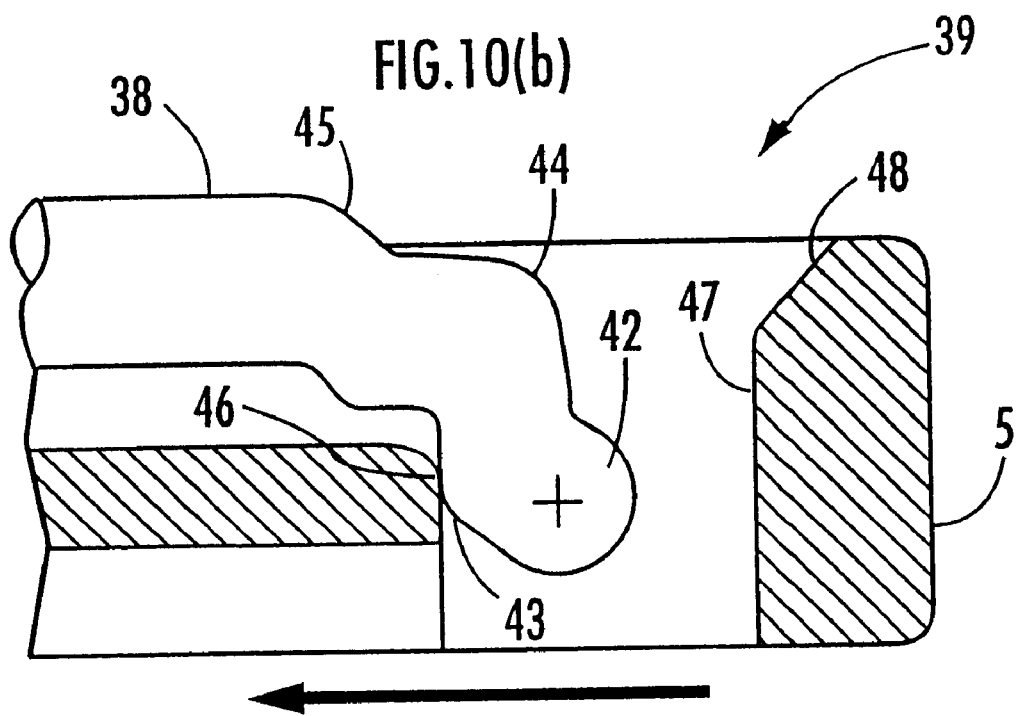

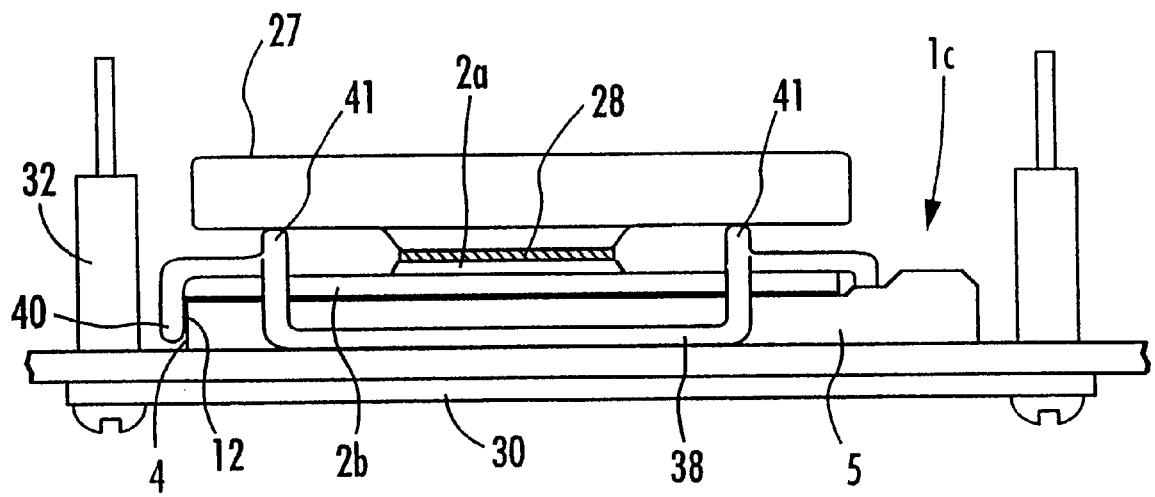
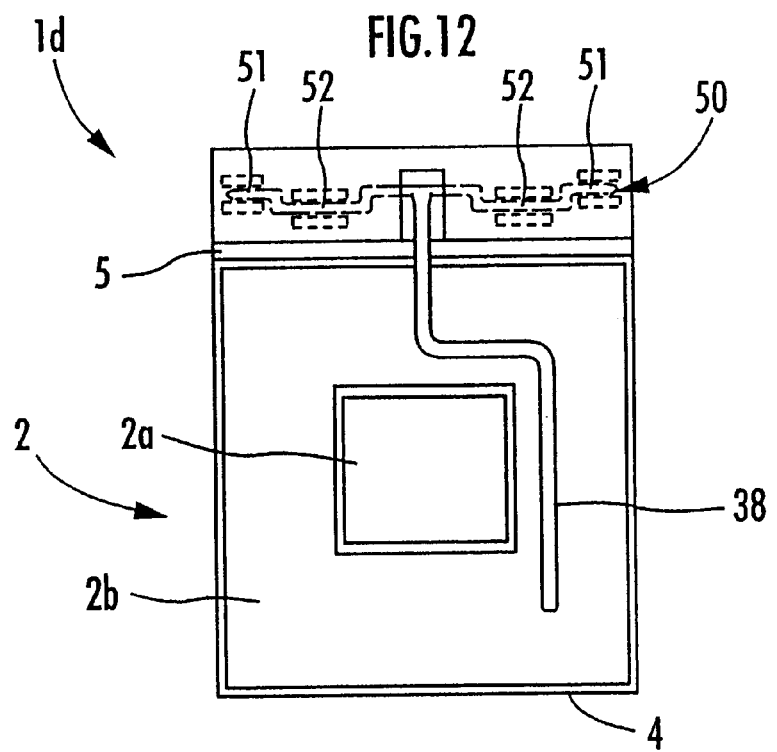

PRIOR ART

CONNECTOR FOR INTEGRATED CIRCUITS, AND ASSEMBLY FOR USE ON INTEGRATED CIRCUITS

BACKGROUND OF THE INVENTION

1. Field of the Invention

The present invention relates to a connector for detachably mounting an integrated circuit such as a CPU or the like on a circuit board, and an assembly of a heat radiator for radiating the heat of an integrated circuit and a connector for detachably mounting the integrated circuit on a circuit board.

2. Description of the Related Art

There are known connectors for detachably mounting integrated circuits such as CPUs or the like on circuit boards. FIG. 15 of the accompanying drawings shows one such connector 61 which is surface-mounted on a circuit board 3 and receives a CPU 2 mounted thereon. The connector 61 has an inner case 62 fixed to the circuit board 3 with terminals (not shown) connected thereto by reflow soldering, an outer case 63 covering the inner case 62 and slidable back and forth on the surface of the inner case 62, a crank rod 64 interposed between the outer case 63 and the inner case 62, and a lever 65 for turning the crank rod 64 to slide the outer case 63 over the inner case 62.

While the lever 65 is in an upright position, pins 2c of the CPU 2 are inserted into respective through holes 66 which are defined in the outer case 63 and the inner case 62. Then, the lever 65 is tilted forward to turn the crank rod 64, sliding the outer case 63 forward. The pins 2c of the CPU 2 are now connected to an electric circuit (not shown) on the circuit board 3.

The CPU 2 comprises a circuit panel 2a with a built-in electronic circuit and a terminal panel 2b with the pins 2c to which signals from the circuit panel 2a are transmitted. When the CPU 2 is energized, the circuit panel 2a generates heat and reaches a high temperature. Therefore, a heat radiator (not shown) such as a heat pipe or the like is mounted on the circuit panel 2a for cooling the CPU 2. The heat radiator is attached to the surface of the circuit panel 2a by a substance of high heat conductivity such as silicone grease or the like.

When attempts are made to remove the heat radiator from the CPU 2 for the purpose of replacing the CPU 2 or the like, the CPU 2 tend to be lifted due to the bonding capability of the silicone grease or the like. If the CPU 2 as it is installed on the connector 61 is lifted, then the pins 2c of the CPU 2 and the terminals in the connector 61 are possibly damaged, making it impossible to reuse the CPU 2 and the circuit board 3.

It has been customary to cover the CPU 2 and the heat radiator with a metal box in order to prevent electromagnetic waves generated when the CPU 2 is in operation from being radiated out of the CPU 2. However, the metal box which houses the CPU 2 and the heat radiator tends to present an obstacle to recent efforts which are being made to reduce the size of the housing of personal computers or the like which incorporate the CPU 2.

SUMMARY OF THE INVENTION

It is an object of the present invention to provide an improved connector for an integrated circuit and an improved assembly for use on an integrated circuit.

Another object of the present invention is to provide a connector for mounting an integrated circuit having a heat radiator, the connector allowing the heat radiator to be removed without causing damage to the integrated circuit, and an assembly for use on such an integrated circuit.

Still another object of the present invention is to provide a connector for an integrated circuit, which is capable of blocking electromagnetic waves from the integrated circuit and which can be reduced in size, and an assembly for use on such an integrated circuit.

To achieve the above objects, there is provided according to a first aspect of the present invention a connector for detachably connecting an integrated circuit to a circuit board, the integrated circuit having a rectangular terminal panel and a circuit panel mounted on and projecting upwardly from a surface of the terminal panel, with a heat radiator mounted on the circuit panel, the heat radiator being wider than the circuit panel, electrically conductive, and grounded, the connector comprising an inner case for being fixed to the circuit board, an outer case mounted on the inner case for sliding movement back and forth over the inner case, and a control member pivotally supported by a rear portion of the inner case and angularly movable to slide the outer case back and forth over the inner case, the arrangement being such that the control member is erected, the outer case is slid rearward, and the integrated circuit is placed in the outer case and the inner case, after which the control member is turned down and the outer case is slid forward to connect the integrated circuit and the circuit board to each other, that the control member is brought into abutment against the surface of the terminal panel when the control member is turned down against the integrated circuit, and that the control member is disposed between the heat radiator and the terminal panel when the heat radiator is installed on the circuit panel.

With the connector according to the first aspect, the control member is held in abutment against the surface of the terminal panel, and when the heat radiator is installed, the control member is disposed between the heat radiator and the terminal panel. Therefore, the integrated circuit can be removed from the connector while the control member is being held in abutment against the terminal panel. By removing the heat radiator while holding the control member, the force applied to the integrated circuit when the heat radiator is detached is reduced by the control member. The heat radiator can thus be removed without causing damage to the integrated circuit.

According to a second aspect of the present invention, there is also provided a connector for detachably connecting an integrated circuit to a circuit board, the integrated circuit having a rectangular terminal panel and a circuit panel mounted on and projecting upwardly from a surface of the terminal panel, the connector comprising an inner case for being fixed to the circuit board, an outer case mounted on the inner case for sliding movement back and forth over the inner case, and a control member pivotally supported by a rear portion of the inner case and angularly movable to slide the outer case back and forth over the inner case, the arrangement being such that the control member is erected, the outer case is slid rearward, and the integrated circuit is placed in the outer case and the inner case, after which the control member is turned down and the outer case is slid forward to connect the integrated circuit and the circuit board to each other, and that the control member is brought into abutment against the surface of the terminal panel and locked by the outer case or the inner case against upward movement when the control member is turned down.

With the connector according to the second aspect, when the control member is turned down, the control member is brought into abutment against the surface of the circuit panel. The control member has its rear portion pivotally supported by the inner case and its front portion locked by the inner case or the outer case. Since the integrated circuit is held in the outer case and the inner case by the control member, the heat radiator can be detached from the integrated circuit without causing damage to the integrated circuit.

In the connectors according to the first and second aspects, the control member may be superposed on the integrated circuit while the integrated circuit is placed in the outer case and the inner case, the control member may have an opening through which the circuit panel is exposed, and the control member may cover the surface of the terminal panel in its substantial entirety, a front edge of the integrated circuit, and lateral side edges of the integrated circuit.

In the connectors according to the first and second aspects, the control member may be superposed on the integrated circuit while the integrated circuit is placed in the outer case and the inner case, and the control member may cover a rear portion of the surface of the terminal panel and rear portions of lateral side edges of the integrated circuit.

The control member may have pivot shaft projections serving as pivot shafts and eccentric shaft projections serving as eccentric shafts, the inner case may have pivot shaft supports pivotally supporting the pivot shafts, and the outer case may have eccentric shaft engaging members engaging the eccentric shafts.

The pivot shaft projections may have respective bottomed pivot shaft grooves which are open upwardly and pivotally support the pivot shaft projections, and the pivot shaft grooves may have retentive members for preventing the pivot shaft projections from being dislodged upwardly when the pivot shaft projections are supported in the pivot shaft grooves. The retentive members are effective to prevent the control member from being dislodged from the outer case and the inner case when the control member is operated on.

The inner case or the outer case should preferably have a keeper for preventing the control member from turning further back when the control member is erected. Inasmuch as the control member is prevented by the keeper from being turned further back, the control member does not damage any electronic circuits and parts which may possibly be disposed behind the connector on the circuit board.

In the connector according to the first aspect, the control member should preferably have a locking member for engaging the outer case or the inner case to prevent the control member from moving upwardly when the control member is turned down. With the control member having the locking member, the integrated circuit is firmly held on the connector by the control member. The heat radiator can thus be removed without damaging the integrated circuit.

Preferably, the control member has a shield for blocking electromagnetic waves produced by the integrated circuit. Because the shield can block electromagnetic waves produced by the integrated circuit, no electromagnetic waves are emitted out of the connector even when the clock frequency of the integrated circuit is increased.

The control member may be coated with an electrically conductive paint, or plated with a metal layer, or may have an electrically conductive tape applied thereto. The control member may include a metal panel or a metal mesh.

In the connectors according to the first and second aspects, the control member may comprise a bent metal bar.

The control member may have a retracting bent portion and an advancing bent portion which extend from a pivot shaft pivotally supported by the rear portion of the inner case, the retracting bent portion being positioned rearward of the pivot shaft to move the outer case rearward when the control member is erected, the advancing bent portion begin positioned forward of the pivot shaft to move the outer case forward when the control member is turned down.

Preferably, the control member extends forward from a substantially central joint of a pivot shaft pivotally supported laterally by the rear portion of the inner case, and has eccentric shafts disposed laterally on opposite sides of the joint and displaced off-center from the pivot shaft. When the eccentric shafts are turned by the control member extending from the joint, uniform forces are applied from the control member to the control member, thus allowing the outer case to move forward uniformly in its lateral direction. Therefore, the integrated circuit is smoothly connected to the circuit board.

The bent metal bar is preferably covered with a synthetic resin layer. When the integrated circuit is installed in position, the control member abuts against the surface of the terminal panel. Since the surface of the bent metal bar is covered with a synthetic resin layer, the control member does not damage the terminal panel even when the integrated circuit vibrates.

According to a third aspect of the present invention, there is provided a connector for detachably connecting an integrated circuit to a circuit board, the integrated circuit having a rectangular terminal panel and a circuit panel mounted on and projecting upwardly from a surface of the terminal panel, with a heat radiator mounted on the circuit panel, the heat radiator being wider than the circuit panel, electrically conductive, and grounded, the connector comprising an inner case for being fixed to the circuit board, an outer case mounted on the inner case for sliding movement back and forth over the inner case, a control member pivotally supported by a rear portion of the inner case and angularly movable to slide the outer case back and forth over the inner case, and a locking cover for being locked by the inner case or the outer case, the locking cover having an opening through which the circuit panel is exposed, covering the surface of the terminal panel in its substantial entirety and covering the control member, the arrangement being such that the locking cover is disposed between the heat radiator and the terminal panel when the heat radiator is installed on the circuit panel.

With the integrated circuit, the outer case, and the inner case being covered with the locking cover, since the control member is covered by the locking cover, the integrated circuit cannot be removed unless the locking cover is detached. When the heat radiator is removed from the integrated circuit, since the integrated circuit is locked by the locking cover, forces applied to the integrated circuit are reduced. The heat radiator can thus be removed with no damage caused to the integrated circuit.

The locking cover should preferably have a shield for blocking electromagnetic waves produced by the integrated circuit. As the shield is capable of blocking electromagnetic waves, it is not necessary to use other members to block electromagnetic waves produced by the integrated circuit. Consequently, it is possible to reduce the size of the entire assembly including the circuit board.

There is also provided in accordance with a fourth aspect of the present invention an assembly for use on an integrated circuit, comprising a connector for detachably mounting an integrated circuit on a circuit board, the integrated circuit having a rectangular terminal panel and a circuit panel mounted on and projecting upwardly from a surface of the terminal panel, and a heat radiator mounted on the circuit panel, the heat radiator being wider than the circuit panel, electrically conductive, and grounded, the connector comprising an inner case for being fixed to the circuit board, an outer case mounted on the inner case for sliding movement back and forth over the inner case, and a control member pivotally supported by a rear portion of the inner case and angularly movable to slide the outer case back and forth over the inner case, the arrangement being such that the control member is erected, the outer case is slid rearward, and the integrated circuit is placed in the outer case and the inner case, after which the control member is turned down and the outer case is slid forward to connect the integrated circuit and the circuit board to each other, the control member being superposed on the integrated circuit while the integrated circuit is placed in the outer case and the inner case, and having a shield for blocking electromagnetic waves produced by the integrated circuit, the shield and the heat radiator jointly serving to block electromagnetic waves produced by the integrated circuit.

As the heat radiator usually used with the integrated grated circuit is electrically conductive and the control member of the connector has the shield, it is possible to block electromagnetic waves generated by the heat radiator and the connector. As a result, other members need to be used to block electromagnetic waves produced by the integrated circuit, making it possible to reduce the size of the entire assembly including the circuit board.

Preferably, the shield is electrically connected to the heat radiator and grounded through the heat radiator. Since only the heat radiator is required to be grounded, the shield does not need to be individually grounded.

Preferably, the shield has an opening through which the circuit panel is exposed, covers the terminal panel in its substantial entirety, and has a first projection projecting upwardly around the opening, the heat radiator having a second projection projecting downwardly from a surface thereof which faces the shield, the first projection and the second projection jointly surrounding the periphery of the circuit panel in transverse directions thereof when the heat radiator is mounted on the circuit panel. Because the periphery of the circuit panel in transverse directions thereof is surrounded by the first projection and the second projection which are electrically conductive members, electromagnetic waves produced by the integrated circuit are more reliably be prevented from leaking out.

There is further provided in accordance with a fifth aspect of the present invention an assembly for use on an integrated circuit, comprising a connector for detachably mounting an integrated circuit on a circuit board, the integrated circuit having a rectangular terminal panel and a circuit panel mounted on and projecting upwardly from a surface of the terminal panel, a heat radiator mounted on the circuit panel, the heat radiator being wider than the circuit panel, electrically conductive, and grounded, the connector comprising an inner case for being fixed to the circuit board, an outer case mounted on the inner case for sliding movement back and forth over the inner case, and a control member pivotally supported by a rear portion of the inner case and angularly movable to slide the outer case back and forth over the inner case, the arrangement being such that the control member is erected, the outer case is slid rearward, and the integrated circuit is placed in the outer case and the inner case, after which the control member is turned down and the outer case is slid forward to connect the integrated circuit and the circuit board to each other, and an electrically conductive locking cover for being locked by the inner case or the outer case, the locking cover having an opening through which the circuit panel is exposed, covering the surface of the terminal panel in its substantial entirety and covering the control member, the locking cover being disposed between the heat radiator and the terminal panel, electrically connected to the heat radiator, and grounded through the heat radiator.

The electrically conductive locking cover of the connector is effective to prevent electromagnetic waves produced by the terminal panel from leaking out, and the heat radiator is effective to prevent electromagnetic waves produced by the circuit panel from leaking out. The locking cover and the heat radiator thus prevent electromagnetic waves from the integrated circuit from leaking without the need for other members.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 2 is an exploded perspective view of the connector according to the first embodiment;

FIG. 9(a) is a plan view of a connector according to a third embodiment of the present invention;

FIG. 9(b) is a front elevational view of the connector according to the third embodiment;

FIGS. 9(c) and 9(d) are plan views of modifications of the connector according to the third embodiment;

FIGS. 10(a) and 10(b) are fragmentary cross-sectional views of a cam assembly of the connector according to the third embodiment;

FIG. 11 is a side elevational view of the connector according to the third embodiment with a heat radiator mounted thereon;

FIG. 12 is a plan view of a modification of the connector according to the third embodiment;

DESCRIPTION OF THE PREFERRED EMBODIMENTS

Figure 1:
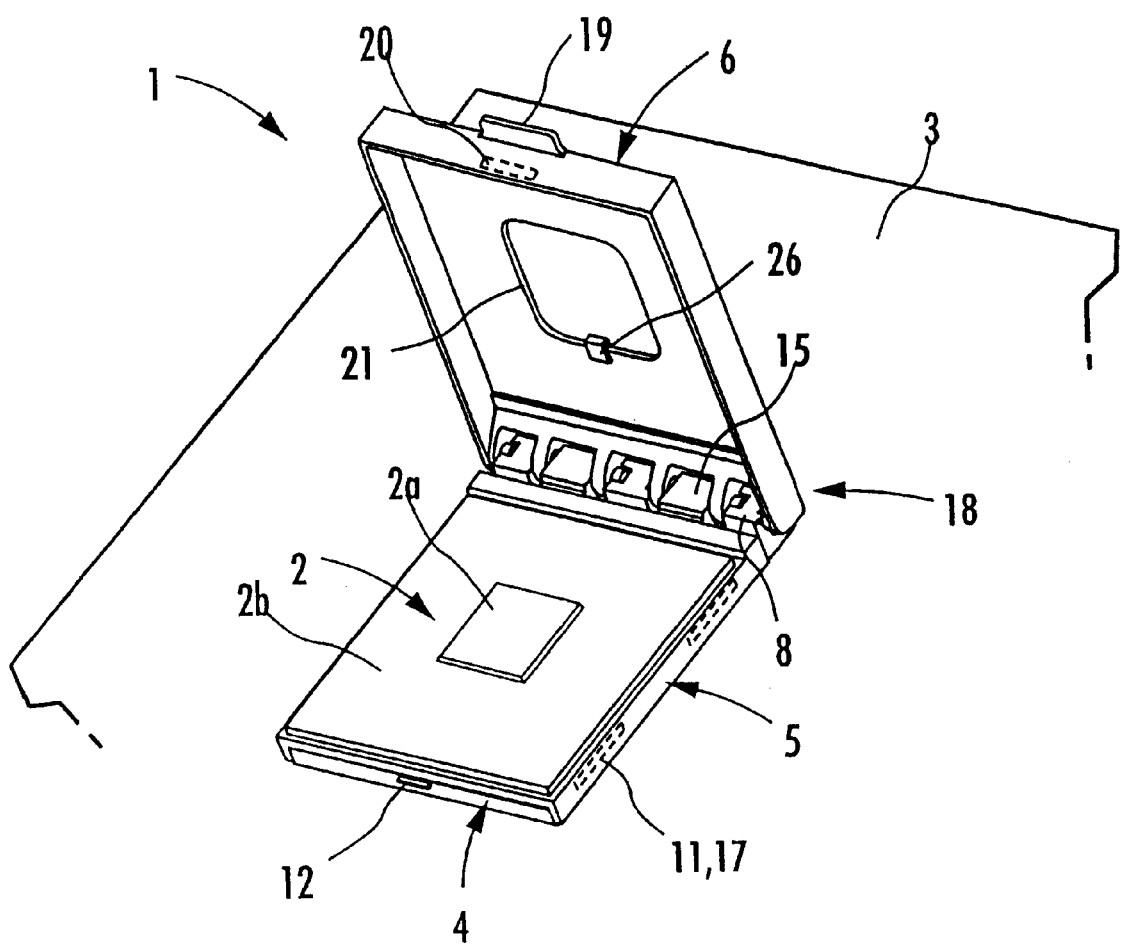
FIG. 1 is a perspective view of a connector according to a first embodiment of the present invention.

A connector according to a first embodiment of the present invention will first be described below with reference to FIGS. 1 through 6(*a*), 6(*b*). As shown in FIG. 1, a connector 1 according to a first embodiment of the present invention serves as a CPU socket for detachably mounting a CPU (integrated circuit) 2 and is surface-mounted on a circuit board 3. The CPU 2 comprises a circuit panel 2*a* with a built-in electronic circuit, a terminal panel 2*b* extending around peripheral edges of the circuit panel 2*a*, and a plurality of pins 2*c* (see FIG. 5(*a*)) projecting downwardly from the terminal panel 2*b*.

The connector 1 has an inner case 4 fixed to the circuit board 3 with terminals (not shown) connected thereto by reflow soldering, an outer case 5 covering the surface of the inner case 4 and slidable back and forth on the surface of the inner case 4, and a cover 6 mounted on the inner case 4 and the outer case 5 for fully covering the CPU 2. In the present embodiment, the cover 6 doubles as a control member for sliding the outer case 5 back and forth on the inner case 4.

Figure 3A:
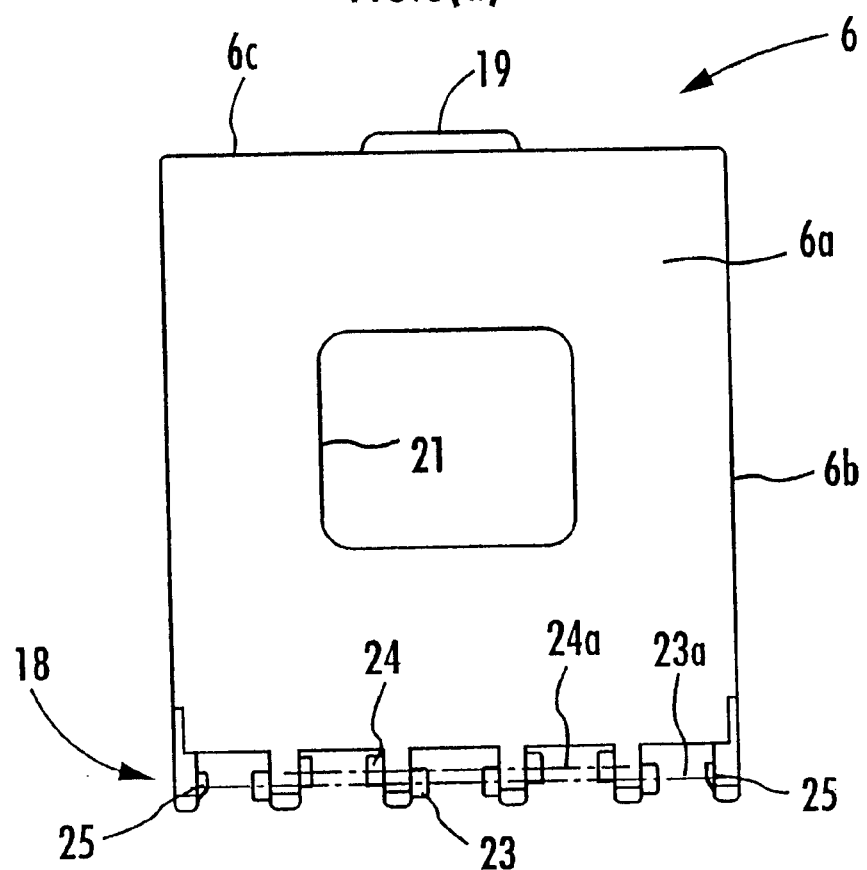
FIG. 3(a) is a plan view of a cover of the connector according to the first embodiment.
Figure 3B:
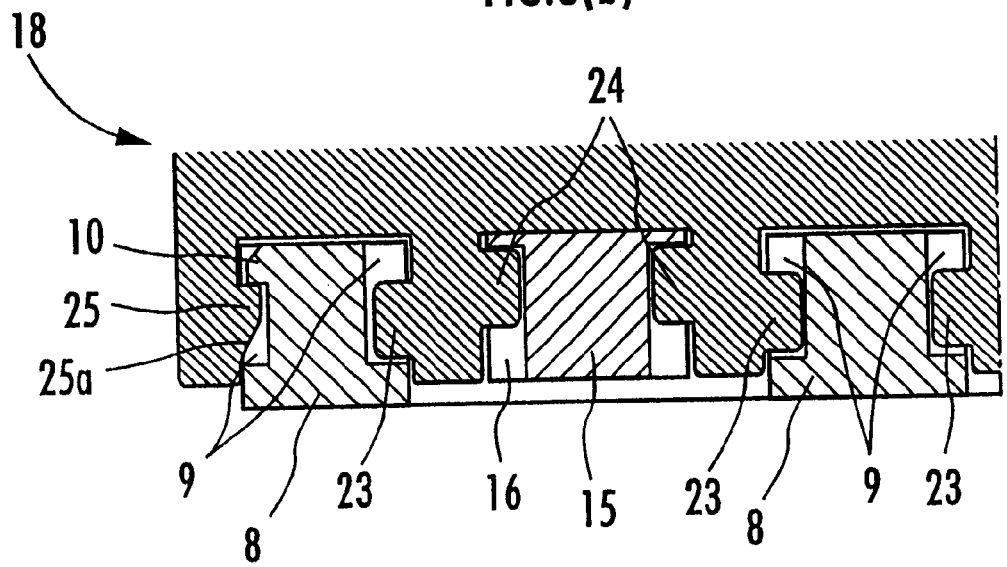
FIG. 3(b) is a cross-sectional view of a cam assembly of the connector according to the first embodiment.

As shown in FIG. 2, the inner case 4 has a plurality of through holes 7 defined therein for insertion of the pins 2*c* therethrough. Terminals (not shown) are mounted respectively in the through holes 7 for connecting the pins 2*c* to an electric circuit (not shown) on the circuit board 3. The inner case 4 has three spaced pivot shaft supports 8 projecting rearward from a rear edge thereof for supporting a rear portion of the cover 6. The pivot shaft supports 8 have bottomed grooves 9 which are open upwardly. Locking steps 10 are disposed in the grooves 9 in those pivot shaft supports 8 which are positioned on left and right ends of the inner case 4. The locking steps 10 serve to engage respective retentive teeth 25 of the cover 6. As shown in FIG. 3(*b*), the locking steps 10 are shallower than the bottoms of the grooves 9 in the transverse direction of the inner case 4.

The inner case 4 has guide ridges 11, two on each side thereof, which slidably engage in respectively guide slots 17 defined in the outer case 5. The inner case 4 also has a tooth 12 on its front end for engaging in a locking slot 20 defined in the front end of the cover 6. The pivot shaft supports 8 have a cover keeper 13 on their rear ends for preventing the cover 6 from turning further back from an erected position as shown in FIG. 4(*a*).

As shown in FIG. 2, the outer case 5 has a plurality of through holes 14 defined therein for insertion of the pins 2*c* therethrough. The outer case 5 has left and right side walls 5*a* extending downwardly from respective left and right side edges thereof for covering the left and right side edges of the inner case 4. The outer case 5 also has eccentric shaft engaging members 15 projecting rearward from a rear edge thereof and disposed between the pivot shaft supports 8 of the inner case 4. The eccentric shaft engaging members 15 have bottomed grooves 16 which are open downwardly. Eccentric shaft projections 24 on the cover 6 engage respectively in the grooves 16. The guide slots 17 are defined in the left and right side walls 5*a* of the outer case 5 for being guided back and forth by the guide ridges 11 of the inner case 4.

As shown in FIG. 2, the cover 6 comprises an upper panel 6*a* covering the upper surface of the outer case 5, left and right side walls 6*b* covering the left and right side edges of the outer case 5, a front wall 6*c* covering the front edges of the outer case 5 and the inner case 4, and a cam assembly 18 disposed on the rear end of the cover 6. The front wall 6*c* has a tab 19 projecting forward from its front surface and a locking slot 20 defined in its inner surface for receiving the tooth 12 on the inner case 4. The upper panel 6*a* has a circuit opening 21 defined centrally therein for exposing the circuit panel 2*a* of the CPU 2 when the cover 6 is closed over the CPU 2. In the present embodiment, the surfaces of the upper panel 6*a*, the left and right side walls 6*b*, and the front wall 6*c* of the cover 6 are covered with a plated metal layer, providing a shield 22.

As shown in FIG. 3(*a*), the cam assembly 18 comprises six cams projecting rearward (downward in FIG. 3(*a*)) from the upper panel 6*a*. The cam assembly 18 has pivot shafts 23*a* and eccentric shafts 24*a*. The four inner cams of the cam assembly 18 are disposed between the pivot shaft supports 8 of the inner case 4 and the eccentric shaft engaging members 15 of the outer case 5, and the left and right outer cams of the cam assembly 18 are disposed on outer sides of the pivot shaft supports 8 of the inner case 4.

The cam assembly 18 has pivot shaft projections 23 making up the pivot shafts 23*a* and supported by the pivot shaft supports 8 of the inner case 4 and eccentric shaft projections 24 making up the eccentric shafts 24*a* and engaged by the eccentric shaft engaging members 15 of the outer case 5. The eccentric shaft projections 24 are displaced off-center upwardly from the pivot shaft projections 23 in FIG. 3(*a*). Those pivot shaft projections 23 which are mounted on the left and right side walls 6*b* of the cover 6 serve as retentive teeth 25 having downwardly inclined surfaces 25*a* as shown in FIGS. 3(*a*) and 3(*b*).

The inner case 4, the outer case 5, and the cover 6 are assembled together as follows: The pivot shaft projections 23 of the cam assembly 18 are inserted into the grooves 9 defined in the pivot shaft supports 8. As described above, the locking steps 10 are disposed in the grooves 9 in those pivot shaft supports 8 which are positioned on left and right ends of the inner case 4, and shallower than the bottoms of the grooves 9 in the transverse direction of the inner case 4, and those pivot shaft projections 23 which are mounted on the left and right side walls 6*b* serve as retentive teeth 25 with the inclined surfaces 25*a*. Therefore, the pivot shaft projections 23 move downwardly (FIGS. 3(*a*) and 3(*b*)) as the inclined surfaces 25*a* are pushed outwardly by the locking steps 10, until finally the retentive teeth 25 are brought into the grooves 9 below the locking steps 10. Once the retentive teeth 25 are placed in the grooves 9 below the locking steps 10, the cover 6 cannot be removed from the inner case 4 as the retentive teeth 25 are engaged by the locking steps 10.

Then, the outer case 5 is mounted on the surface of the inner case 4. At this time, the outer case 5 is positionally adjusted to bring the eccentric shaft projections 24 of the cam assembly 18 into the grooves 16 in the eccentric shaft engaging members 15 of the outer case 15, and to bring the guide ridges 11 on the side edges of the inner case 4 into the guide slots 17 defined in the inner surfaces of the side walls 5*a* of the outer case 5. Since the outer case 5 is held in engagement with the inner case 4 through the engagement of the guide ridges 11 in the guide slots 17, the outer case 5 is prevented from disengaging from the inner case 4. Then, a metal clip 26 for electric connection to a heat radiator 27 (described later on) is mounted on an edge of the circuit opening 21 of the cover 6. The connector 1 thus assembled is then surface-mounted on the circuit board 3 in a reflow furnace (not shown).

The CPU 2 is then installed on the circuit board 3 with the connector 1 mounted thereon from above the outer case 5.

Figure 4A:
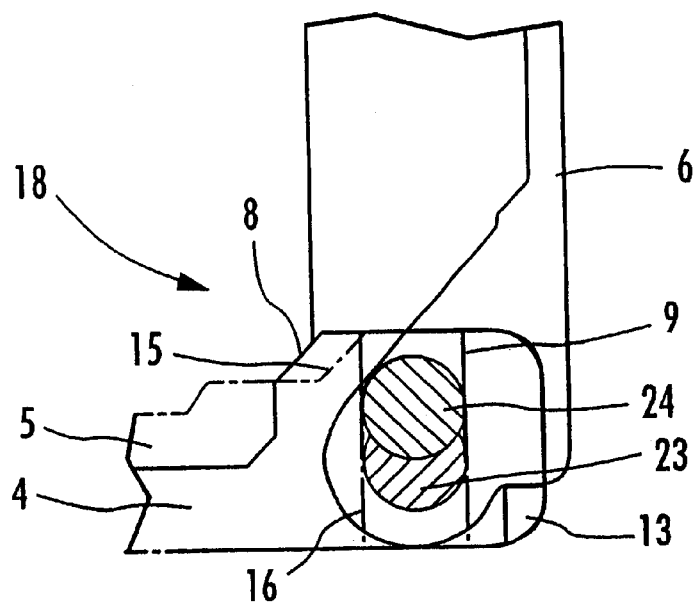
FIGS. 4(a) through 4(c) are fragmentary side elevational views showing the manner in which the cam assembly operates.
Figure 5A:
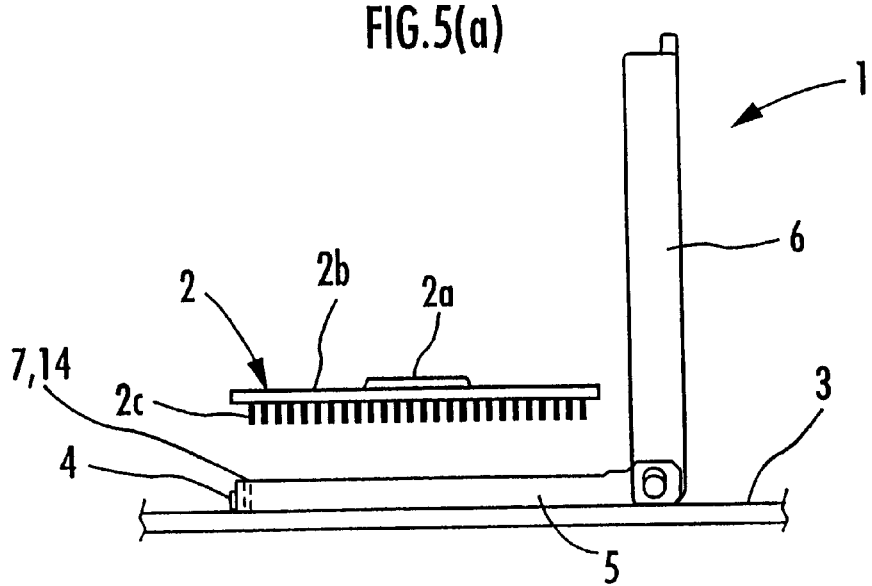
FIGS. 5(a) through 5(c) are side elevational views showing the manner in which a CPU is mounted on the connector according to the first embodiment.

At this time, as shown in FIGS. 4(a) and 5(a), the cover 6 is erected substantially perpendicularly to the circuit board 3. The pins 2c of the CPU 2 are inserted into the through holes 14 in the outer case 5 and the through holes 7 in the inner case 4. At present, the pins 2c are not electrically connected to the terminals in the through holes 7 in the inner case 4. Then, the cover 6 is angularly moved forward about the pivot shaft projections 23 of the cam assembly 18.

Figure 4B:
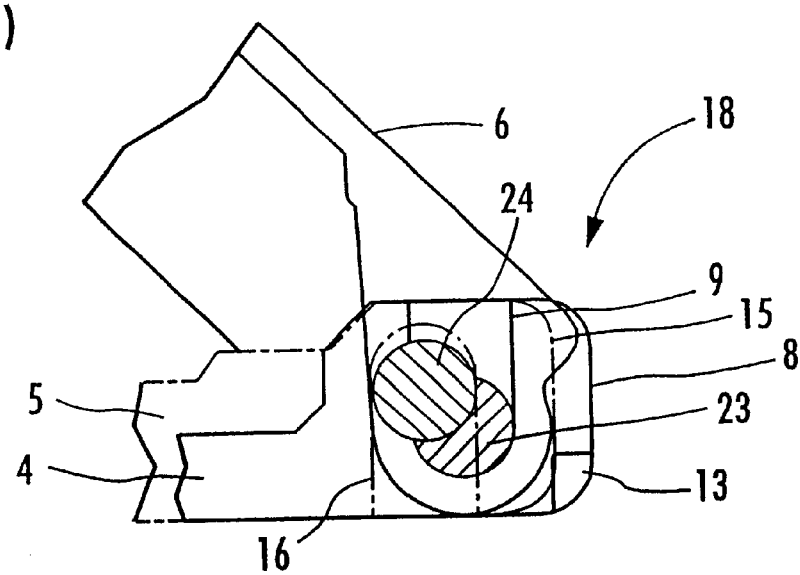
Figure 4C:
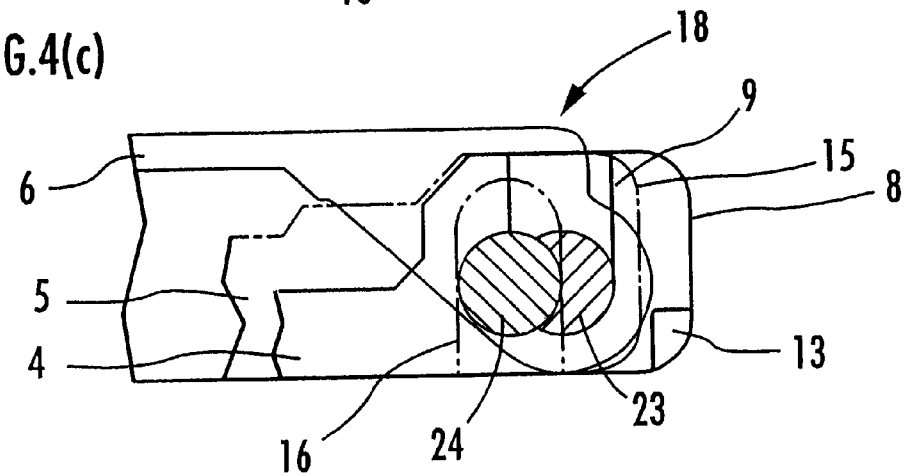

As shown in FIGS. 4(a) through 4(c), the eccentric shaft projections 24 move forward, pushing the eccentric shaft engaging members 15 forward. When the cover 6 is fully turned down into overlapping relation to the CPU 2, as shown in FIGS. 4(c) and 5(c), the outer case 5 is moved forward by the eccentric shaft projections 24, causing the pins 2c of the CPU 2 to be electrically connected to the terminals in the through holes 7 in the inner case 4. When the CPU 2 is thus mounted on the connector 1, therefore, the terminal panel 2b of the CPU 2 is covered by the cover 6.

In the present embodiment, since the retentive teeth 25 of the cover 6 are prevented from moving upwardly by the locking steps 10, the cover 6 can smoothly be turned down without the cam assembly 18 moving upwardly. When the cover 6 is erected substantially perpendicularly to the inner case 4, the rear end of the cam assembly 18 abuts against the cover keeper 13 on the rear ends of the pivot shaft supports 8, as shown in FIG. 4(a). Since the cover 6 is prevented from being further turned rearward, the cover 6 does not damage any electronic circuits and parts which may possibly be disposed behind the connector 1.

Figure 6A:
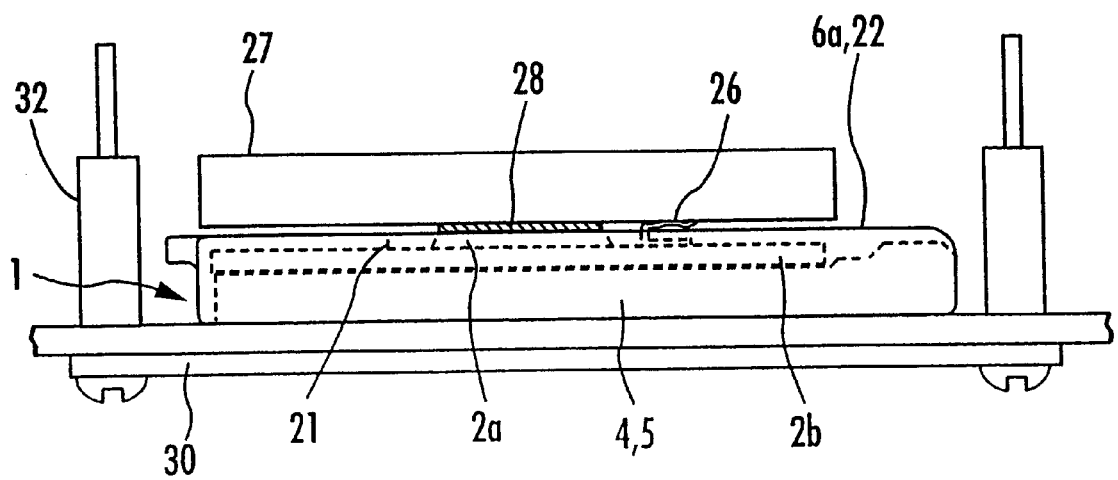
FIGS. 6(a) and 6(b) are side elevational views showing the manner in which the connector according to the first embodiment is fixed in position by a fixing device.

Then, as shown in FIG. 6(a), a heat radiator 27 is mounted on the circuit panel 2a of the CPU 2 mounted on the connector 1. Specifically, the surface of the circuit panel 2a is coated with a silicone grease 28. Then, the heat radiator 27 is mounted on the circuit panel 2a from above the surface of the silicone grease 28. The silicone grease 28 has a relatively large bonding capability, making it difficult for the heat radiator 27 to be detached from the CPU 2. The silicone grease 28 also has a property to transfer heat easily.

The heat radiator 27 is made of aluminum alloy and has an area wider than the circuit panel 2a of the CPU 2 and the circuit opening 21 in the cover 6. When the heat radiator 27 is mounted on the CPU 2, the heat radiator 27 is overlaps the surface of the upper panel 6a of the cover 6. The shield 22 of the cover 6 and the heat radiator 27 are electrically connected to each other by the clip 26 which is mounted on the edge of the circuit opening 21 of the cover 6.

Figure 6B:
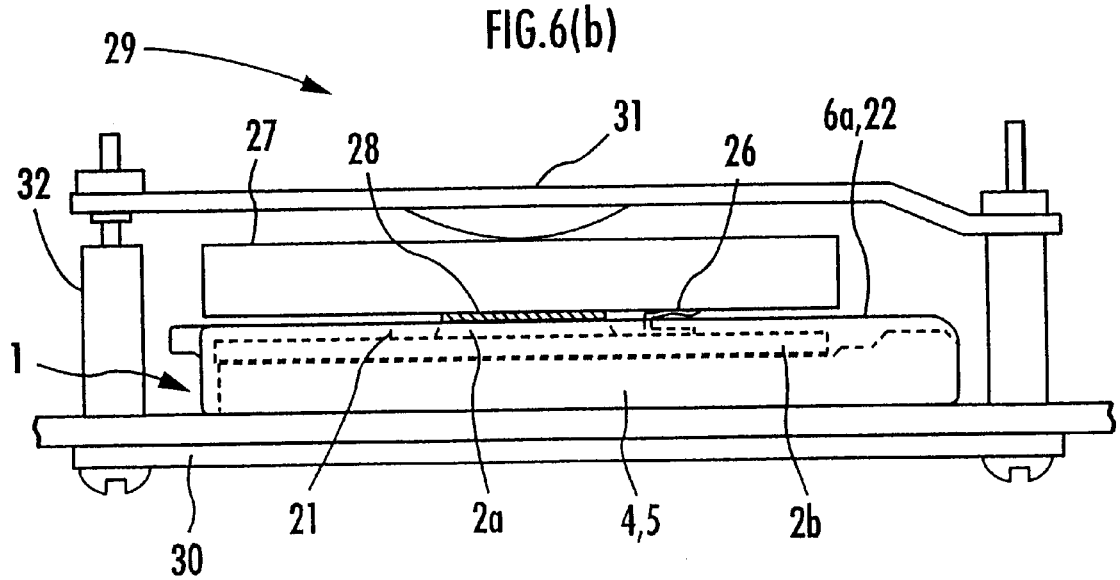

The heat radiator 27 is fixed to the circuit board 3 by a fixing device 29 shown in FIG. 6(b). The fixing device 29 comprises a rear plate 30 disposed on the reverse side of the circuit board 3, a fixing plate 31 disposed above the heat radiator 27 and pressing the heat radiator 27 toward the circuit board 3, and joints 32 joining the rear plate 30 and the fixing plate 31 to each other these components of the fixing device 29 are electrically conductive, and grounded with the rear plate 30 being connected to a grounding circuit (not shown).

The surface of the cover 6 is covered with a plated metal layer, providing the shield 22, and the metal clip 26 is mounted on the cover 6. The heat radiator 27 and the shield 22 are electrically connected to each other by the clip 26. The shield 22 is thus connected to the grounding circuit by the clip 26, the heat radiator 27, and the fixing device 29. Therefore, electromagnetic waves that are radiated when the CPU 2 is energized are blocked by the cover 6 covered with the shield 22 and the electrically conductive heat radiator 27.

Since the heat radiator 27 is positioned above the surface of the cover 6, the cover 6 can be removed for replacement of the CPU 2 only after the heat radiator 27 is detached. When the heat radiator 27 is removed, the CPU 2 remains held in the outer case 5 and the inner case 4 by the cover 6. Consequently, when the heat radiator 27 is removed from the CPU 2, the CPU 2 is prevented from being detached from the connector 1 and the pins 2c, etc. of the CPU 2 are prevented from being damaged.

Figure 5B:
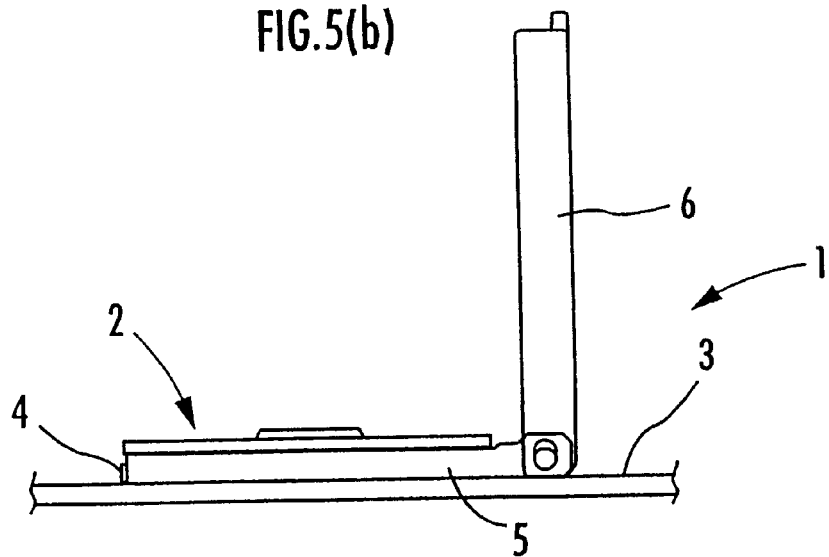
Figure 5C:
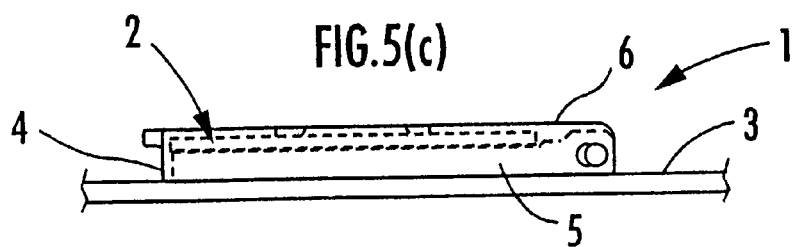

After the heat radiator 27 is removed from the CPU 2, the tab 19 of the cover 19 is lifted to erect the cover 6 as shown in FIG. 5(b). The outer case 5 slides rearward, disconnecting the pins 2c of the CPU 2 from the terminals in the inner case 4. Then, the CPU 2 is lifted off the connector 1.

Figure 5D:
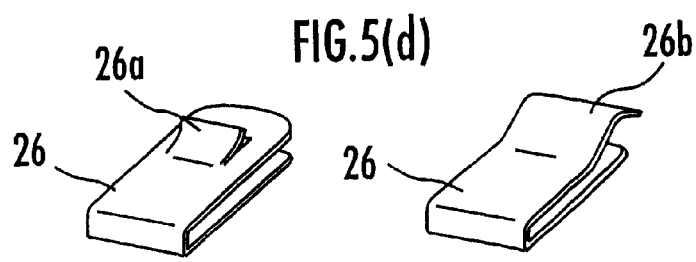
FIG. 5(d) is a perspective view of electrically conductive clips for use on the connector according to the first embodiment.

The clip 26 may have a lance 26a as shown in a left-hand side of FIG. 5(d), or may have a bent portion 26b as shown in a right-hand side of FIG. 5(d). In the present embodiment, the heat radiator 27 is bonded to the circuit panel 2a of the CPU 2 by the silicone grease 28. However, the heat radiator 27 may be secured position by any of various known means.

Figure 7A:
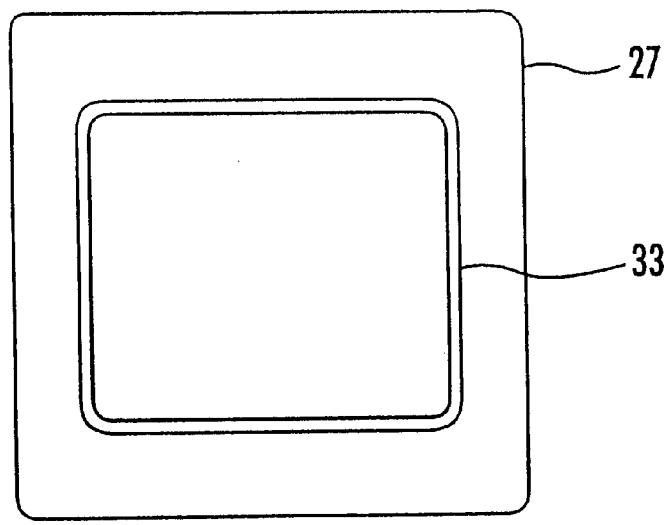
FIGS. 7(a) through 7(c) are views showing a modification of the connector according to the first embodiment.
Figure 7B:
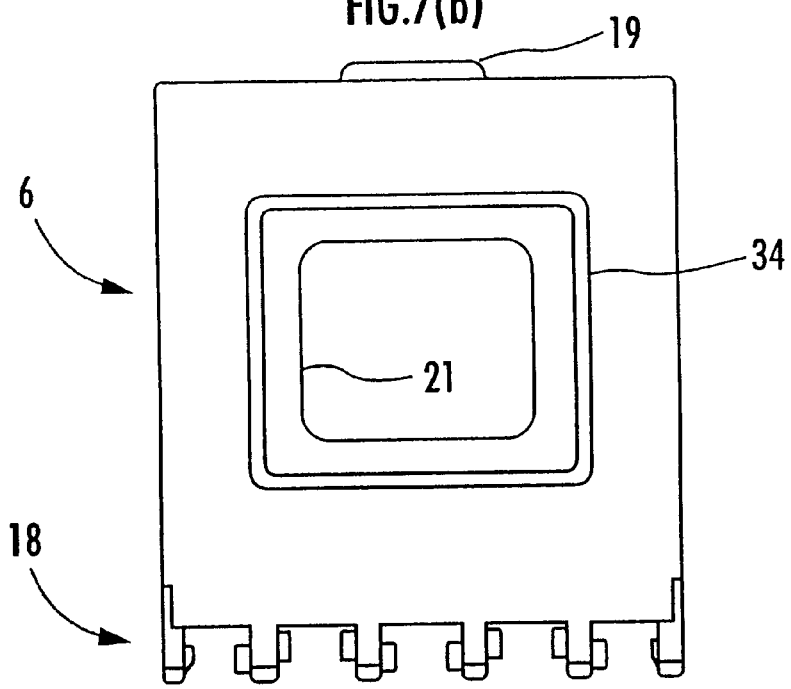
Figure 7C:
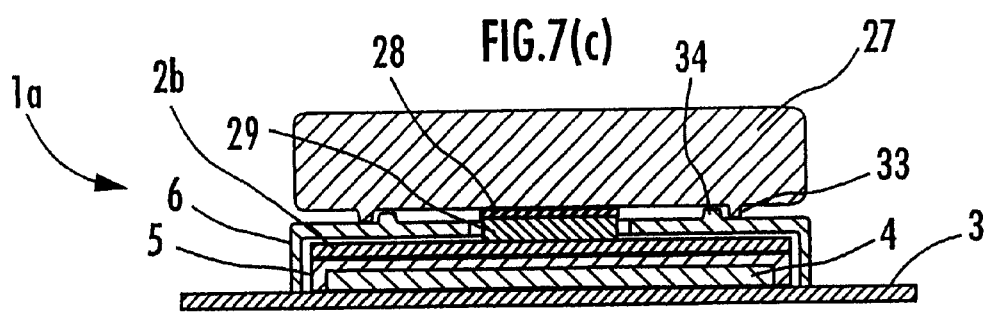

An assembly for use on an integrated circuit, which has a connector 1a according to a modification of the first embodiment, will be described below. In this modification, as shown in FIGS. 7(a) and 7(c), the heat radiator 27 has a first annular projection (first projection) 33 projecting downwardly from a lower surface thereof. As shown in FIGS. 7(b) and 7(c), the cover 6 has a second annular projection (second projection) 34 projecting upwardly from an upper surface thereof in surrounding relation to the first annular projection 33 inserted therein.

According to the present modification, the cover 6 is molded of an electrically conductive synthetic resin which comprises a synthetic resin and a carbon or metal powder mixed therewith. The electrically conductive synthetic resin is melted and injection-molded into the cover 6 with the carbon or metal powder localized on its surface to turn the surface into an electrically conductive shield. Other structural details of the modified connector 1a are identical to the connector according to the first embodiment, and will not be described in detail below.

For installing the CPU 2 on the connector 1a, the CPU 2 is placed in the inner case 4 and the outer case 5, and then the cover 6 is turned down to cover the CPU 2, after which the heat radiator 27 is mounted on the cover 6 above the CPU 2. At this time, as shown in FIG. 7(c), the first annular projection 33 on the heat radiator 27 is inserted in the second annular projection 34 on the cover 6, whereupon side edges of the circuit panel 2a of the CPU 2 are closed by the first annular projection 33 and the second annular projection 34. Therefore, electromagnetic waves emitted from the CPU 2 are blocked against radiation from the assembly by the first annular projection 33 and the second annular projection 34.

In the modification illustrated in FIGS. 7(a) through 7(c), each of the first and second projections 33, 34 is of an annular shape. However, each of the first and second projections may be of a C shape, and the first and second projections may be combined with each other so as to surround the periphery of the circuit panel 2a in its transverse directions. Although the first and second projections 33, 34 are provided one each in the illustrated modification, a plurality of first projections and a plurality of second projections may be employed.

Figure 8A:
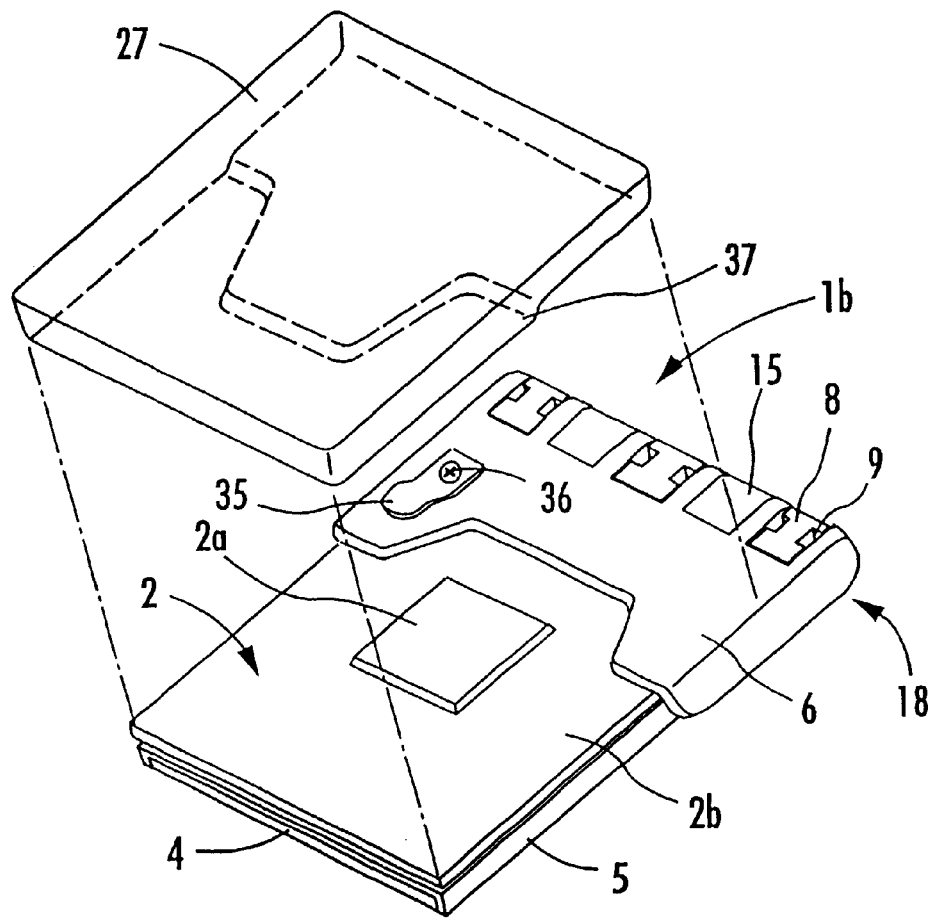
FIGS. 8(a) and 8(b) are perspective and side elevational views, respectively, of a connector according to a second embodiment of the present invention.
Figure 8B:
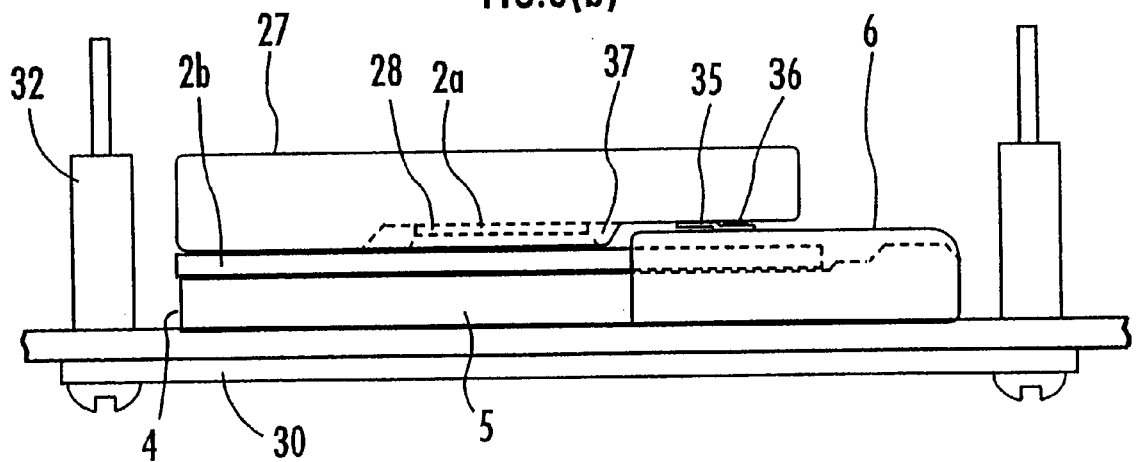

An assembly for use on an integrated circuit, which has a connector 1b according to a second embodiment of the present invention, will be described below with reference to FIGS. 8(a) and 8(b). As shown in FIG. 8(a), the connector 1b according to the second embodiment has a cover 6 for covering a substantially rear half of the terminal panel 2b of the CPU 2. The cover 6 comprises a metal panel (not shown) serving as a shield and covered with a layer of synthetic resin formed by insert molding. A metal tip 35 is fastened to the upper surface of the cover 6 by a self-tapping screw 36 which is threaded into the metal panel of the cover 6. Therefore, the tip 35 and the metal panel of the cover 6 are electrically connected to each other.

As shown in FIGS. 8(*a*) and 8(*b*), the heat radiator 27 according to the second embodiment has a projection or land 37 projecting downwardly which has an edge that is complementary in shape to the front edge of the cover 6. Other structural details of the connector 1*b* according to the second embodiment are identical to the connector according to the first embodiment, and will not be described in detail below.

For installing the CPU 2 on the connector 1*b*, the CPU 2 is placed in the inner case 4 and the outer case 5, and then the cover 6 is turned down into contact with the surface of the CPU 2. The rear portion of the terminal panel 2*b* is covered by the cover 6.

The surface of the circuit panel 2*a* is coated with a silicone grease 28, and then the heat radiator 27 is installed. As shown in FIG. 8(*b*), the heat radiator 27 is now mounted on the circuit panel 2*a*. Since the downward projection 37 is disposed on the reverse side of the heat radiator 27, the side edges of the circuit 2*a* are surrounded by the projection 37 and the cover 6. The heat radiator 27 is electrically connected to the cover 6 by the tip 35. The heat radiator 27 is also connected to a grounding circuit, as with the previous embodiment. Therefore, electromagnetic waves emitted from the CPU 2 are blocked against radiation from the assembly by the projection 37 and the cover 6.

In the second embodiment, the cover 6 employs the metal panel as the shield. However, the cover 6 may employ a metal mesh (not shown) as the shield. Since such a metal mesh is capable of blocking electromagnetic waves, no electromagnetic waves are emitted from the cover 6.

An assembly for use on an integrated circuit, which has a connector 1*c* according to a third embodiment of the present invention, will be described below with reference to FIGS. 9(*a*) through 11. As shown in FIGS. 9(*a*) and 9(*b*), the connector 1*c* according to the third embodiment has a control member for sliding the outer case 5 back and forth in the form of a lever 38 bent from a metal bar.

The lever 38 has a cam assembly 39 on its rear end and a locking member 40 on its front end for engaging the tooth 12 of the inner case 4. The lever 38 comprises a metal bar covered with a synthetic resin layer. The synthetic resin layer is formed by placing a heat-shrinkable synthetic resin pipe over the metal bar and then heating the heat-shrinkable synthetic resin pipe. As shown in FIGS. 9(*a*) and 9(*b*), the lever 38 is shaped such that it contacts the surface of the terminal panel 2*b* when the lever 38 is turned down forward onto the CPU 2. As shown in FIG. 11, the lever 38 has support protrusions 41 disposed near front and rear ends of the portions thereof which contact the terminal panel 2*b*, the support protrusions 41 contacting the reverse surface of the heat radiator 27 when the heat radiator 27 is mounted on the CPU 2.

As shown in FIGS. 10(*a*) and 10(*b*), the cam assembly 39 of the lever 38 has pivot shafts 42 supported by the inner case 4. As shown in FIG. 10(*b*), the cam assembly 39 also has an advancing bent portion 43 which is bent obliquely forward of each of the pivot shafts 42 when the lever 38 is turned down, and a retracting bent portion 44 which extends upwardly from the advancing bent portion 43 and is bent forward when the lever 38 is turned down. In FIG. 10(*a*), the cam assembly 39 also has a lever keeper 45 extending upwardly and bent to the right from the retracting bent portion 44 for engaging a third abutment surface 48 of the outer case 5 to prevent the lever 38 from turning further back from an erected position of the lever 38 in which the lever 38 is substantially perpendicular to the outer case 5.

As shown in FIGS. 10(*a*) and 10(*b*), the outer case 5 has in its rear portion a first abutment surface 46 for abutting against the advancing bent portion 43 of the lever 38, a second abutment surface 47 for abutting against the retracting bent portion 44 of the lever 38, and a third abutment surface 48 for abutting against the lever keeper 45 of the lever 38. Other structural details of the connector 1*c* according to the third embodiment are identical to the connector according to the first embodiment, and will not be described in detail below.

For installing the CPU 2 on the connector 1*c*, the lever 38 is erected substantially perpendicularly to the circuit board 3. At this time, since the pivot shafts 42 of the lever 38 are supported by the case 4, as shown in FIG. 10(*a*)), the lever 38 is turned about the pivot shafts 42. The lever 38 is turned while the retracting bent portion 44 is pushing the second abutment surface 47 rearward (to the right in FIG. 10(*a*)). Then, the CPU 2 is placed in the inner case 4 and the outer case 5. When the lever 38 is turned down forward from the erected position, the lever 38 is turned forward about the pivot shafts 42.

At this time, as shown in FIG. 10(*b*), the lever 38 is turned while the advancing bent portion 43 is pushing the first abutment surface 46 forward (to the left in FIG. 10(*b*)). The outer case 5 is slid forward, causing the pins 2*c* of the CPU 2 to be electrically connected to the terminals in the through holes 7 in the inner case 4. As shown in FIGS. 9(*a*) and 9(*b*), the locking member 40 on the front end of the lever 38 engages the tooth 12 on the front end of the inner case 4. The CPU 2 is now secured to the connector 1*c* by the lever 38.

Then, as shown in FIG. 11, the heat radiator 27 is mounted on the circuit panel 2*a* of the CPU 2 mounted on the connector 1*c*, with the silicone grease 28 interposed between the heat radiator 27 and the circuit panel 2*a*. At this time, the reverse side of the heat radiator 27 is held in abutment against the support protrusions 41 of the lever 38. The heat radiator 27 is held down by the fixing plate 31 of the fixing device 29, pressing the CPU 2 against the connector 1*c* with the support protrusions 41.

In the third embodiment, since the lever 38 is held against the surface of the terminal panel 2*b*, the CPU 2 is held on the connector 1*c* even when the heat radiator 27 is removed. Consequently, when the heat radiator 27 is removed from the CPU 2, the CPU 2 is prevented from being detached from the connector 1*c* and the pins 2*c*, etc. of the CPU 2 are prevented from being damaged. Inasmuch as the metal bar of the lever 38 is covered with the synthetic resin, the surface of the terminal panel 2*b* is not worn even when the lever 28 held in contact with the terminal panel 2*b* vibrates.

After the heat radiator 27 is removed from the CPU 2, the locking member 40 of the lever 38 is disengaged from the tooth 12 of the inner case 4 and lifted to erect the lever 38. The outer case 5 is slid rearward, disconnecting the pins 2*c* of the CPU 2 from the terminals in the inner case 4. The CPU 2 can then easily be detached from the connector 1*c* when the CPU 2 is lifted.

In the third embodiment, the lever 38 is not limited to the shape shown in FIGS. 9(*a*) and 9(*b*), but may be shaped as shown in FIGS. 9(*c*) and 9(*d*). Specifically, in FIG. 9(*c*), a connector 1*c*' has a lever 38 including a cam assembly 39 of a conventional crank structure and extending straight downwardly from the cam assembly 39 in FIG. 9(c). In FIG. 9(d), a connector 1c" has a lever 38 bent to extend on one side of the circuit panel 2a out of interference therewith. The lever 38 thus bent is advantageous in that if the heat radiator 27 comprises a heat pipe, the lever 38 is kept out of interference with pipes and cables connected to the heat radiator 27.

A connector 1d according to a modification of the third embodiment will be described below with reference to FIG. 12. As shown in FIG. 12, the connector 1d has a lever 38 including a cam assembly in the form of a crank rod 50 extending transversely in rear portions of the outer case 5 and the inner case 4. The crank rod 50 has two pivot shafts 51 supported by the inner case 4 and two eccentric shafts 52 displaced off-center from the pivot shafts 51. The eccentric shafts 52 are displaced off-center forward from the pivot shafts 51 when the lever 38 is turned down forward, and engage the outer case 5.

The lever 38 extends from an intermediate portion of the crank rod 50 between the eccentric shafts 52 and is bent out of interference with the circuit panel 2a of the CPU 2. According to the present modification, the lever 38 comprises a metal bar covered with a layer of synthetic resin formed by insert molding. The lever 38 does not have a locking member on its front end for engaging a tooth of the inner case 4. Other structural details of the connector 1c according to the present modification are identical to the connector according to the third embodiment, and will not be described in detail below.

For installing the CPU 2 on the connector 1d, the CPU 2 is placed in the inner case 4 and the outer case 5, and then the lever 38 is turned down forward. Since the lever 38 extends from the intermediate portion of the crank rod 50 between the eccentric shafts 52, the force applied to the lever 38 is imposed uniformly on the eccentric shafts 52. Therefore, the outer case 5 is slid smoothly forward.

According to the present modification, as shown in FIG. 12, the lever 38 is bent out of interference with the circuit panel 2a of the CPU 2, and hence abuts against the surface of the circuit panel 2a. Then, the heat radiator 27 is mounted in place from above the CPU 2. Since the heat radiator 27 projects laterally beyond the circuit panel 2a, the lever 28 is disposed between the heat radiator 27 and the terminal panel 2b of the CPU 2. Therefore, the heat radiator 27 can be removed from the CPU 2 while the lever 38 is being held in abutment against the terminal panel 2b.

The force applied to the CPU 2 at this time can be reduced by removing the CPU 2 while holding the lever 38.

Figure 13:
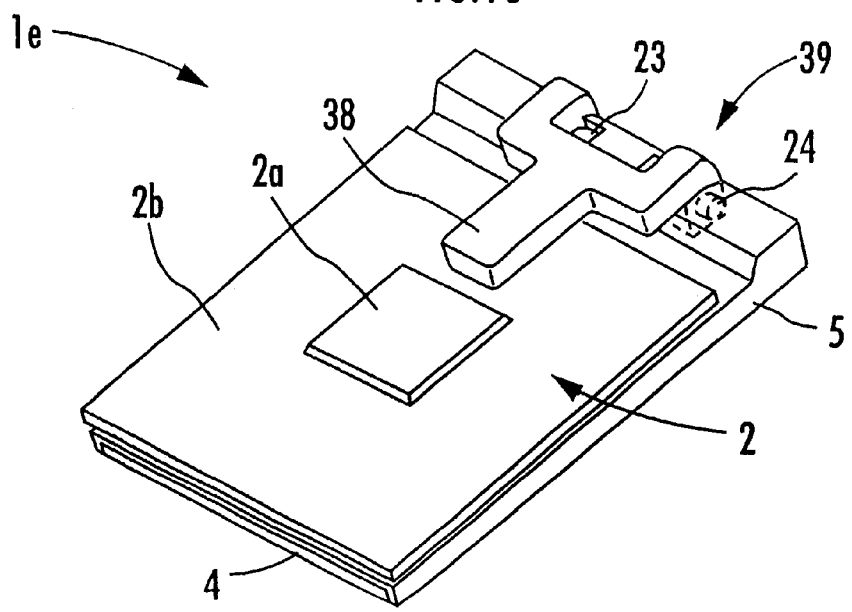
FIG. 13 is a perspective view of another modification of the connector according to the third embodiment.

A connector 1e according to a second modification of the third embodiment will be described below with reference to FIG. 13. As shown in FIG. 13, the connector 1e has a lever 38 whose length is selected such that its distal front end is positioned behind the circuit panel 2a when the CPU 2 is mounted in place. The lever 28 has a cam assembly 39 on its rear end, which, as shown in FIG. 13, projects rearward as a bifurcated structure and has pivot shaft projections 23 projecting inwardly toward each other and eccentric shaft projections 24 projecting outwardly away from each other. The pivot shaft projections 23 are supported by pivot shaft supports (not shown) of the inner case 4, and the eccentric shaft projections 24 are supported by eccentric shaft engaging members (not shown) of the outer case 5.

For installing the CPU 2 on the connector 1e, the CPU 2 is placed in the inner case 4 and the outer case 5, and then the lever 38 is turned down forward. Since the lever 38 lies behind the circuit panel 2a, the lever 38 is held in abutment against the surface of the terminal panel 2b. Then, the heat radiator 27 is mounted in place from above the CPU 2, and the lever 38 is disposed between the heat radiator 27 and the terminal panel 2b. The heat radiator 27 can be removed from the CPU 2 while the lever 38 is being held in abutment against the terminal panel 2b. The force applied to the CPU 2 at this time can be reduced by removing the CPU 2 while holding the lever 38.

Figure 14:
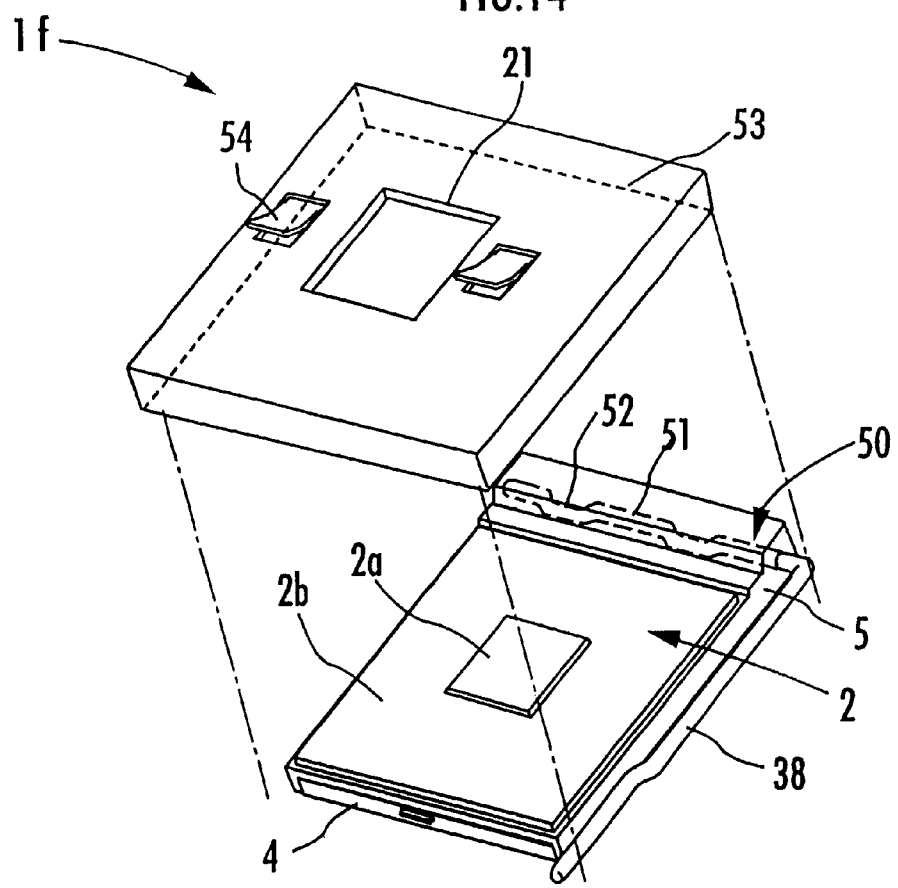
FIG. 14 is a perspective view of a connector according to a fourth embodiment of the present invention.
Figure 15:
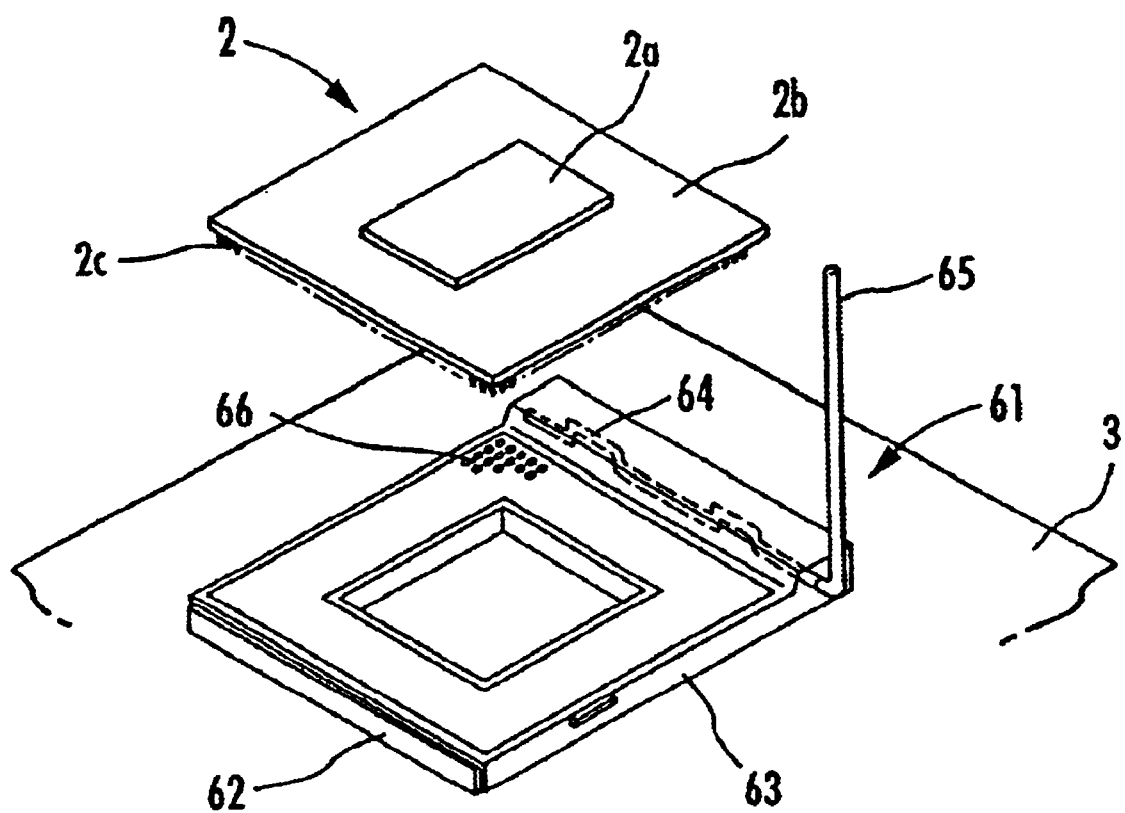
FIG. 15 is a perspective view of a conventional connector.

A connector 1f according to a fourth embodiment of the present invention will be described below with reference to FIG. 14. As shown in FIG. 14, the connector 1f has a control member for sliding the outer case 5 back and forth on the inner case 4, in the form of a lever 38 which is produced by bending a metal bar. Specifically, the lever 38 has a crank rod 50 disposed in the rear portions of the outer case 5 and the inner case 4 and including pivot shafts 51 supported by the inner case 4 and eccentric shafts 52 displaced off-center from the pivot shafts 51. The lever 38 projects outwardly from side edges of the outer case 5 and the inner case 4, and is bent perpendicularly to the pivot shafts 51.

In the fourth embodiment, the connector 1f includes a locking cover 53 which covers the CPU 2 and the connector 1f after the CPU 2 is installed on the connector 1f. The locking cover 53 comprises a metal panel serving as a shield and a synthetic resin layer covering the metal panel, and has connectors 54 disposed on its surface through which the metal panel of the locking cover 53 is exposed. The locking cover 53 is of such a size as to cover the lever 38 which has been turned down forward, from above. The locking cover 53 is locked by teeth (not shown) on side walls of the outer case 5.

The locking cover 53 has a circuit opening 21 defined centrally therein for exposing the circuit panel 2a of the CPU 2 when the upper surface of the CPU 2 is covered with the locking cover 53. Other structural details of the connector 1f according to the fourth embodiment are identical to the connector according to the other embodiments, and will not be described in detail below.

In the fourth embodiment, as with the conventional connector, the lever 38 is erected to slide the outer case 5 rearward, and then the CPU 2 is installed from above the outer case 5 and the inner case 4. The lever 38 is turned down forward to slide the outer case 5 forward, electrically connecting the CPU 2 to the electric circuit on the circuit board 3. Then, the locking cover 53 is installed from above the CPU 2. At this time, the lever 38 is accommodated in the locking cover 53.

Then, the heat radiator 27 is mounted on the CPU 2. The heat radiator 27 projects laterally beyond the circuit panel 2a, so that the heat radiator 27 is positioned over the locking cover 53. Since the reverse surface of the heat radiator 27 is held in abutment against the connectors 54, the heat radiator 27 and the locking cover 53 are electrically connected to each other. As with the previous embodiments, the heat radiator 27, the CPU 2, and the connector 1f are secured to the circuit board 3 by the fixing device 29.

With the connector 1f according to the fourth embodiment, the locking cover 53 includes the metal panel which is connected to the electrically conductive heat radiator 27 by the connectors 54. The heat radiator 27 is connected to the grounding circuit by the fixing device 29. Therefore, electromagnetic waves that are radiated when the CPU 2 is energized are blocked by the locking cover 53 and the heat radiator 27.

As the heat radiator 27 is positioned upwardly of the surface of the locking cover 53, the locking cover 53 can be removed for replacement of the CPU 2 only after the heat radiator 27 is detached. When the heat radiator 27 is removed, the CPU 2 remains held in the outer case 5 and the inner case 4 by the engaging cover 6. Consequently, when the heat radiator 27 is removed from the CPU 2, the CPU 2 is prevented from being detached from the connector 1f and the pins 2c, etc. of the CPU 2 are prevented from being damaged.

Although certain preferred embodiments of the present invention have been shown and described in detail, it should be understood that various changes and modifications may be made therein without departing from the scope of the appended claims.

What is claimed is:

1. A connector for detachably connecting an integrated circuit to a circuit board, the integrated circuit having a rectangular terminal panel and a circuit panel mounted on and projecting upwardly from a surface of the terminal panel, with a heat radiator mounted on the circuit panel, the heat radiator being wider than the circuit panel, electrically conductive, and grounded, said connector comprising:

an inner case for being fixed to the circuit board;

an outer case mounted on said inner case for sliding movement back and forth over the inner case; and a control member pivotally supported by a rear portion of said inner case and angularly movable to slide said outer case back and forth over the inner case;

wherein said control member is erected, said outer case is slid rearward, and said integrated circuit is placed in said outer case and said inner case, after which said control member is turned down and said outer case is slid forward to connect said integrated circuit and said circuit board to each other, said control member is brought into abutment against the surface of said terminal panel when the control member is turned down against said integrated circuit, and said control member is disposed between said heat radiator and said terminal panel when said heat radiator is installed on said circuit panel.

2. A connector according to claim 1, wherein said control member has a locking member for engaging said outer case or said inner case to prevent the control member from moving upwardly when said control member is turned down.

3. A connector for detachably connecting an integrated circuit to a circuit board, the integrated circuit having a rectangular terminal panel and a circuit panel mounted on and projecting upwardly from a surface of the terminal panel, said connector comprising:

an inner case for being fixed to the circuit board;

an outer case mounted on said inner case for sliding movement back and forth over the inner case; and a control member pivotally supported by a rear portion of said inner case and angularly movable to slide said outer case back and forth over the inner case;

wherein said control member is erected, said outer case is slid rearward, and said integrated circuit is placed in said outer case and said inner case, after which said control member is turned down and said outer case is slid forward to connect said integrated circuit and said circuit board to each other, and said control member is brought into abutment against the surface of said terminal panel and locked by said outer case or said inner case against upward movement when the control member is turned down.

4. A connector according to claim 1 or 3, wherein said control member has pivot shaft projections serving as pivot shafts and eccentric shaft projections serving as eccentric shafts, said inner case having pivot shaft supports pivotally supporting said pivot shafts, said outer case having eccentric shaft engaging members engaging said eccentric shafts.

5. A connector according to claim 4, wherein said inner case or said outer case has a keeper for preventing said control member from turning further back when said control member is erected.

6. A connector according to claim 4, wherein said pivot shaft supports have respective bottomed pivot shaft grooves which are open upwardly and pivotally support said pivot shaft projections, said pivot shaft grooves having retentive members for preventing said pivot shaft projections from being dislodged upwardly when said pivot shaft projections are supported in said pivot shaft grooves.

7. A connector according to claim 6, wherein said inner case or said outer case has a keeper for preventing said control member from turning further back when said control member is erected.

8. A connector according to claim 1 or 3, wherein said control member is superposed on said integrated circuit while said integrated circuit is placed in said outer case and said inner case, said control member having an opening through which said circuit panel is exposed, said control member covering the surface of said terminal panel in its substantial entirety, a front edge of said integrated circuit, and lateral side edges of said integrated circuit.

9. A connector according to claim 8, wherein said control member has a shield for blocking electromagnetic waves produced by said integrated circuit.

10. A connector according to claim 9, wherein said control member is coated with an electrically conductive paint.

11. A connector according to claim 9, wherein said control member is plated with a metal layer.

12. A connector according to claim 9, wherein said control member has an electrically conductive tape applied thereto.

13. A connector according to claim 9, wherein said control member includes a metal panel or a metal mesh.

14. A connector according to claim 1 or 3, wherein said control member is superposed on said integrated circuit while said integrated circuit is placed in said outer case and said inner case, said control member covering a rear portion of the surface of said terminal panel and rear portions of lateral side edges of said integrated circuit.

15. A connector according to claim 14, wherein said control member has a shield for blocking electromagnetic waves produced by said integrated circuit.

16. A connector according to claim 15, wherein said control member is coated with an electrically conductive paint.

17. A connector according to claim 15, wherein said control member is plated with a metal layer.

18. A connector according to claim 15, wherein said control member has an electrically conductive tape applied thereto.

19. A connector according to claim 15, wherein said control member includes a metal panel or a metal mesh.

20. A connector according to claim 1 or 3, wherein said control member comprises a bent metal bar.

21. A connector according to claim 20, wherein said control member has a retracting bent portion and an advancing bent portion which extend from a pivot shaft pivotally supported by the rear portion of said inner case, said retracting bent portion being positioned rearward of said pivot shaft to move said outer case rearward when said control member is erected, said advancing bent portion begin positioned forward of said pivot shaft to move said outer case forward when said control member is turned down.

22. A connector according to claim 20, wherein said bent metal bar is covered with a synthetic resin layer.

23. A connector according to claim 20, wherein said control member has a lever extending forward from a substantially central joint of a pivot shaft pivotally supported laterally by the rear portion of said inner case, and eccentric shafts disposed laterally on opposite sides of said joint and displaced off-center from said pivot shaft.

24. A connector according to claim 21 or 23, wherein said bent metal bar is covered with a synthetic resin layer.

25. An assembly for use on an integrated circuit, comprising:

a connector for detachably mounting an integrated circuit on a circuit board, the integrated circuit having a rectangular terminal panel and a circuit panel mounted on and projecting upwardly from a surface of the terminal panel; and a heat radiator mounted on said circuit panel, said heat radiator being wider than the circuit panel, electrically conductive, and grounded;

said connector comprising an inner case for being fixed to the circuit board, an outer case mounted on said inner case for sliding movement back and forth over the inner case, and a control member pivotally supported by a rear portion of said inner case and angularly movable to slide said outer case back and forth over the inner case;

wherein said control member is erected, said outer case is slid rearward, and said integrated circuit is placed in said outer case and said inner case, after which said control member is turned down and said outer case is slid, forward to connect said integrated circuit and said circuit board to each other;

said control member being superposed on said integrated circuit while said integrated circuit is placed in said outer case and said inner case, and having a shield for blocking electromagnetic waves produced by said integrated circuit;

said shield and said heat radiator jointly serving to block electromagnetic waves produced by said integrated circuit.

26. An assembly according to claim 25, wherein said shield is electrically connected to said heat radiator and grounded through said heat radiator.

27. An assembly according to claim 25 or 26, wherein said shield has an opening through which said circuit panel is exposed, covers said terminal panel in its substantial entirety, and has a first projection projecting upwardly around said opening, said heat radiator having a second projection projecting downwardly from a surface thereof which faces said shield, said first projection and said second projection jointly surrounding the periphery of said circuit panel in transverse directions thereof when said heat radiator is mounted on said circuit panel.

* * * * *